United States Patent [19]

Murakami

[11] Patent Number: 4,604,692
[45] Date of Patent: Aug. 5, 1986

[54] OPERATION MODE SETTING SYSTEM FOR A MICROPROCESSOR

[75] Inventor: Joji Murakami, Kawasaki, Japan

[73] Assignee: Fujitsu Limited, Kanagawa, Japan

[21] Appl. No.: 454,258

[22] Filed: Dec. 29, 1982

[30] Foreign Application Priority Data

Dec. 29, 1981 [JP] Japan ............................ 56-213710

[51] Int. Cl.$^4$ .............................................. G06F 3/00
[52] U.S. Cl. ................................................... 364/200
[58] Field of Search ... 364/200 MS File, 900 MS File, 364/715

[56] References Cited

U.S. PATENT DOCUMENTS

| 4,349,870 | 9/1982 | Shaw | 364/200 |
|---|---|---|---|
| 4,361,876 | 11/1982 | Groves | 364/900 |
| 4,388,692 | 6/1983 | Jones | 364/557 |
| 4,432,049 | 2/1984 | Shaw | 364/200 |
| 4,432,052 | 2/1984 | McDonough | 364/200 |
| 4,479,190 | 10/1984 | Takai | 364/556 |
| 4,504,926 | 3/1985 | Toyoda | 364/900 |

OTHER PUBLICATIONS

"Analog-Digital Conversion Notes", Jun. 1977, by Analog Devices Inc., pp. 116 and 124-125.
IBM Technical Disclosure Bulletin, J. P. Dahl et al., vol. 23, No. 7A, Dec., 1980, New York, pp. 2934-2936.
Toute L'Electronique, C. Verbeek, No. 456, Aug.-Sep., 1980, Paris, France, pp. 53-55.
IBM Technical Disclosure Bulletin, J. E. Rohen, vol. 23, No. 8, Jan., 1981, New York, pp. 3613-3614.
Electronics, W. F. Arnold, vol. 52, No. 20, Sep., 27, 1979, New York, pp. 38-39.
Electronic Design, H. Gee et al., vol. 29, No. 7, Mar. 31, 1981, Waseca, Minnesota, Enville, New Jersey, pp. 161-168.

Primary Examiner—James D. Thomas
Assistant Examiner—Florin Munteanu
Attorney, Agent, or Firm—Armstrong, Nikaido, Marmelstein & Kubovcik

[57] ABSTRACT

An operation mode setting system is provided in a microprocessor operable in a plurality of operation modes. The operation mode setting system has a signal input line through which an analog voltage corresponding to any of the respective operation modes is applied to an analog-to-digital converter circuit which is built in the microprocessor. The output signal from the analog-to-digital converter circuit is decoded by a decoder, and the microprocessor is set at the predetermined operation mode in response to the decoded output signal.

6 Claims, 8 Drawing Figures

| CONTROL | SWITCH |
|---------|--------|
| 0 | OFF |
| 1 | ON |

OPERATION MODE SETTING SYSTEM FOR A MICROPROCESSOR

BACKGROUND OF THE INVENTION

1. Field of the Invention

The present invention relates to an operation mode setting system for a microprocessor in which various operation modes are set in multi-valued logic by the use of analog signals.

2. Description of the Prior Art

As microprocessors have progressed, their applications have widened, and systems employing microprocessors have come to have multifarious variations. That is, if it is desired to change, e.g., I/O characteristics, memory maps or the polarities of certain signal lines are changed through simple modifications while fundamental functions are maintained.

On the other hand, it is favorable from the point of view of the reliability and cost of a device itself to mass-produce the IC, especially an LSI such as is used in a microprocessor, by the use of the same mask pattern. Therefore, fundamentally the following three techniques are used at present in order to accomodate the user's extended needs as mentioned above:

(1) Only specified ones of masks are partly and simply modified to meet the desired variations (the so-called master slice method).

(2) External devices are selected for a system by the user. In some cases, such external devices are separately prepared as peripheral devices by the manufacturer.

(3) Several pins of a device are used for assigning specific operation modes, and the device is instructed to start the several operation modes through inputs to the pins.

Microprocessors presently available are constructed so that they can operate in various operation modes, for example, a test mode and a user mode or they can exchange a plurality of kinds of memory maps. These modes are externally set in the two-valued logic through the pins of an integrated circuit chip which forms the microprocessor. The number of the pins for setting the operation modes is, however, limited because a large number of pins are required for allowing the microprocessor to perform functions other than operation mode setting. For this reason, increases in the number of the pins for setting operation modes have been stopped. However, the expedient has still been unsatisfactory, particularly when a comparatively large number of operation modes need to be set.

More specifically, referring back to the aforementioned techniques, the method (1) results in preparing the masks individually. This is undesirable because a certain degree of mass-production is necessary. Moreover, the functions which can be changed by the specified masks are still limited. With the method (2), the user requires the peripheral devices. This poses problems in cost and in reliability. The method (3) is considered to be the best. It incurs no problem when the IC has surplus pins, but the number of pins is usually limited.

There will now be described a prior-art system wherein operation modes are determined by the two-valued logic.

An I/O port register built in a microprocessor is shown in FIG. 1A by way of example. It is assumed that the three upper bits of bits 7, 6 and 5 are used for setting the operation modes. An example of an external circuit in the case of the bus separable extension mode is shown in FIG. 1B. The logical values of pins 10, 9 and 8 are respectively stored in the bits 7, and 5 of the I/O port register. Thus, the operation modes are set.

In the reset status, the pins 10, 9 and 8 of the microprocessor are respectively programmed at "1", "0" and "1" as illustrated in FIG. 1B. In a case where the pins 8–10 are wired to a peripheral circuit and where at the turn-on of a power supply, the peripheral circuit requires signals different from the signals necessary for the mode programming, a switch is needed as shown in FIG. 1B and a circuit shown in FIG. 1C is used for separating the peripheral circuit and the microprocessor during the reset period.

The operation modes after the resetting must be determined in such a way that the user wires the pins 10, 9 and 8 as external hardware. The signals of the three pins are latched in the program control bits PC2, PC1 and PC0 of the I/O port register in FIG. 1A when the reset signal switches to the "1" level.

The circuit of FIG. 1B can be operated in various modes by latching the values of the pins 8, 9 and 10 at the leading edge of a $\overline{\text{RESET}}$ signal.

By way of example, in the case where the processor has four I/O ports 1, 2, 3 and 4, the following modes are possible. All the ports function as I/O ports (single chip mode). The ports 1 and 2 function as I/O ports, the port 3 as a data bus, and the port 4 as a lower bit address bus or a part thereof (bus separable extension mode). The ports 1 and 2 function as I/O ports, the port 3 receives and delivers a lower bit address and data in a time-sharing fashion, and the port 4 delivers an upper bit address (bus time-sharing extension mode). In this mode, the address space of a memory can be enlarged. Thus, the largest utilizable address space is achieved in the bus time-sharing extension mode.

In this manner, the prior art sets operation modes in the two-valued logic by means of an external circuit, which leads to the disadvantage of a large number of pins.

A method for reducing the number of pins for setting operation modes is to use input/output pins in common. In this case, however, the pins must be partitioned in accordance with the change-over of the operation modes. The partitioning inevitably results in the drawback that the input/output electrical characteristics of the mode input pin circuitry changes.

SUMMARY OF THE INVENTION

It is the primary object of the present invention to provide an operation mode setting system for a microprocessor which can set any desired number of operation modes on the basis of multi-valued logic by applying analog input signals through a single input pin, without incurring changes in input/output electrical characteristics thereof, etc.

The above object is accomplished wherein an analog signal, for specifying an operation mode, is converted into a digital value by an analog-to-digital converter circuit, the digital value is then decoded by a decoder, and a microprocessor is set in the predetermined operation mode in response to the decoded output.

DETAILED DESCRIPTION OF THE PREFERRED EMBODIMENTS

Hereunder, embodiments of the present invention will be described with reference to the accompanying drawings.

Figure 1A:
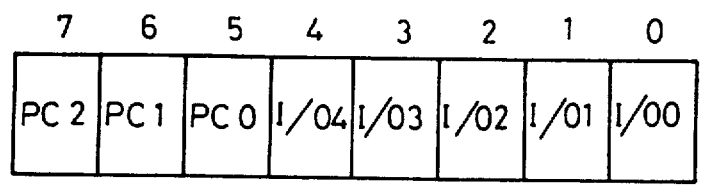
FIG. 1A is a diagram showing a prior art I/O port register.
Figure 1B:
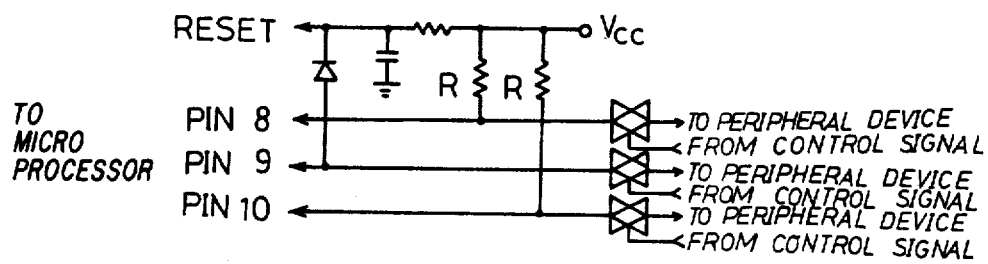
FIG. 1B shows a prior art circuit for setting operation modes.
Figure 1C:
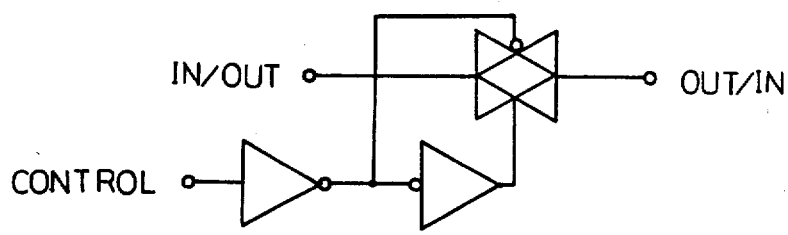
FIG. 1C shows a prior art circuit which is used for separating a processor and a peripheral circuit.
Figure 2:
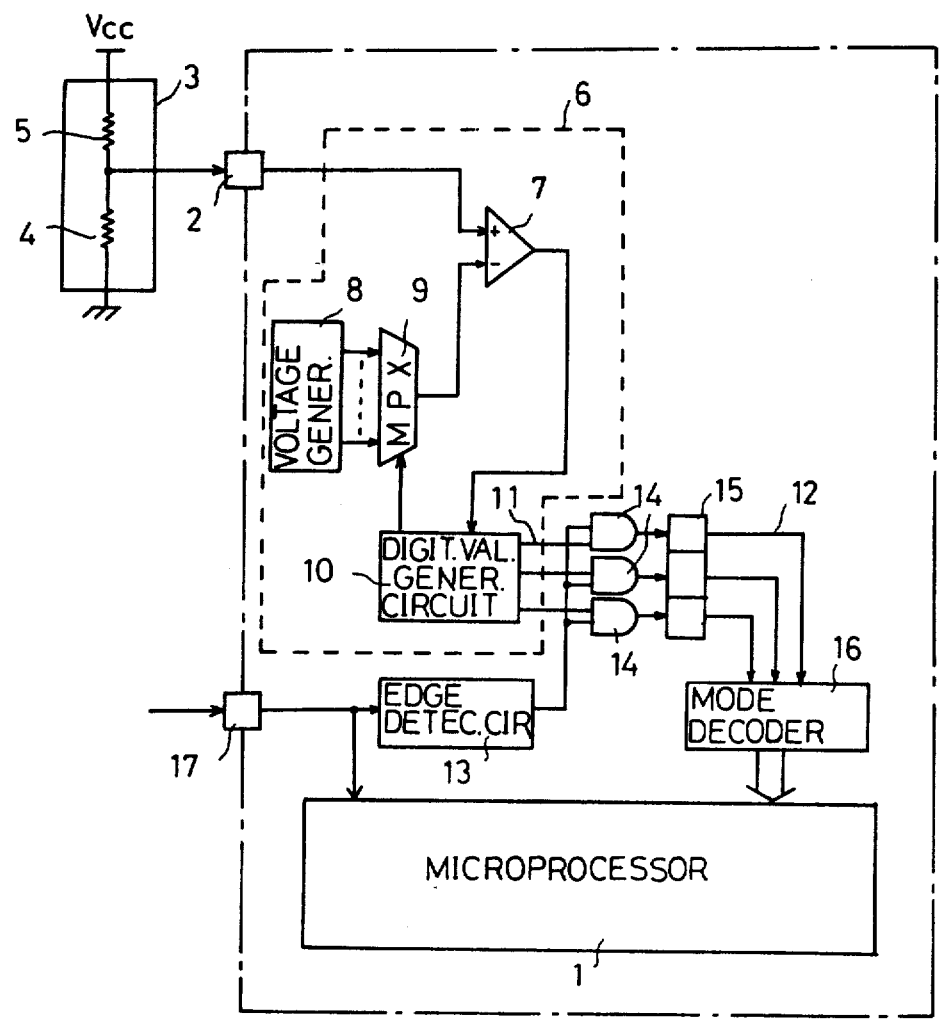
FIG. 2 is a block diagram showing an embodiment of the present invention.

FIG. 2 shows an embodiment of the present invention. Enclosed within a dot-and-dash line is a microprocessor which is formed as an integrated circuit on a single semiconductor substrate. The microprocessor includes a processor portion 1 which operates in a plurality of operation modes. A mode input pin 2, is connected to signal generator circuit means 3 which generates an analog voltage signal specifying the operation mode. The signal generator circuit means 3 is, for example, a voltage divider circuit which consists of resistors 4 and 5. The voltage to be applied to the mode input pin 2 is determined by the voltage division ratio between the resistors 4 and 5.

The mode input pin 2 is connected to an analog-to-digital converter circuit 6 of a sequential comparison type. In this regard, an integral type analog-to-digital converter is usually structurally complicated and requires a large quantity of hardware in order to package it along with the processor portion on one chip. Though slow in operation, the sequential comparison type analog-to-digital converter requires a small quantity of hardware and is satisfactory for setting the operation mode. Thus, in the preferred embodiment, a sequential comparison type analog-to-digital converter is used, however, an integral type analog-to-digital converter and other analog-to-digital converters are also applicable to the present invention. The analog-to-digital converter circuit 6 comprises a comparator circuit 7 one input of which is connected to the mode input pin 2, a voltage generator 8, a multiplexer 9 the inputs of which are connected to the outputs of the voltage generator 8 and the output of which is connected to the other input of the comparator circuit 7, and a digital value generator circuit 10 which, in response to an output signal from the comparator circuit 7, generates a digital value in response to the output of the comparator circuit, and supplies a voltage switching signal to the multiplexer 9.

Bit output lines 11 of the digital value generator circuit 10 are connected to AND gate circuits 14. Each AND gate circuit 14 has a corresponding bit output line 11 connected to one input thereof and has the other input thereof connected to the output of an edge detector circuit 13. The outputs of the AND gate circuits 14 are connected to the inputs of a mode register 15, the output lines 12 of the mode register 15 are connected to a mode decoder 16 and the output of the mode decoder 16 is connected to the processor portion 1. Further, the input of the edge detector circuit 13 is connected to a reset input pin 17, which is connected to the processor portion 1.

Before operating the processor portion 1 in a certain operation mode, the analog voltage signal corresponding to the particular operation mode is generated by the signal generator circuit means 3, and this signal is supplied to and digitized by the analog-to-digital converter circuit 6. The digitization is executed in the following manner. The analog input signal is compared by the comparator circuit 7 with a reference voltage which is one of a plurality of voltages from the voltage generator 8 selected by the multiplexer 9, and an output signal is provided from the comparator circuit 7 until both the voltage signals coincide. In response to this output signal, the digital value generator circuit 10 produces a countup of 1 bit and supplies the voltage switching signal to the multiplexer 9 to feed the comparator circuit 7 with a voltage which is one incremental voltage higher than the preceeding reference voltage. The digital value stored in the digital value generator circuit 10 when the comparator circuit 7 has provided a coincidence output, is equivalent to the supplied analog voltage signal.

Figure 3:
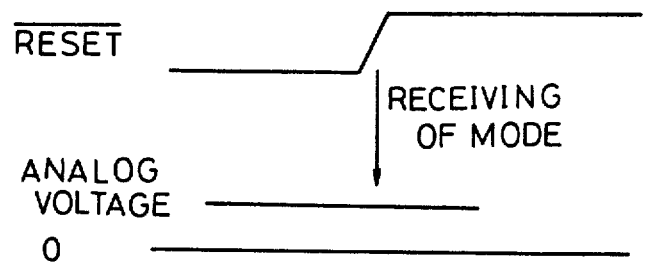
FIG. 3 is a waveform diagram for explaining the load of a mode.

In parallel with the above operation, the $\overline{\text{reset}}$ input pin 17 has applied thereto a low level signal to start the processor portion 1. Upon completion of this operation, the signal of the reset input pin 17 which is at the low level is shifted to a high level signal as shown in FIG. 3. This shift is detected by the edge detector circuit 13, which provides a write pulse to the AND circuits 14. Then the digital value stored in the digital value generator circuit 10, namely, parallel bits for specifying the operation mode is/are loaded into the mode register 15. The digital value is supplied from the register 15 to the mode decoder 16 and is decoded by the latter. The decoded output signal is applied to the processor portion 1. Thus, the processor portion is set at the predetermined operation mode and is operated in that mode.

Figure 4:
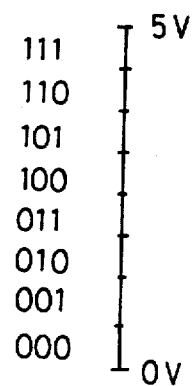
FIG. 4 is a diagram showing the relationship between analog voltages and digital values.

The operation modes can be readily changed by a signal; e.g., voltage from the signal generator circuit means 3 which is changed by adjusting the voltage divider circuit 4, 5; as illustrated in FIG. 4 where (000), (001), . . . correspond to 0 V, 1 V, . . . in the aspect of multi-valued logic. Moreover, since mode changes do not require switching input/output pins as in the prior art, input/output electrical characteristics are not changed. Since only a one pin is sufficient, the problem of the prior art where the number of pins allocated to mode switching has been a restriction to the setting of operation modes can be solved. In addition, the present invention does not involve any limitations to the scale etc. of a microprocessor which has a plurality of operation modes.

While, in the preferred embodiment, the analog-to-digital converter circuit is of the sequential comparison type, it is not restricted to this type. A converter of high precision is not required unless the number of operation modes is very large. Since the number of modes is usually ten or so, an analog-to-digital converter of 3-4 bits suffices, and it can be easily realized. Of course, it is possible to use one channel of an ordinary analog-to-digital converter.

Since the only circuit components to be externally mounted are the two resistors for the voltage division, the circuit is very simple. A change in the resistances of the resistors does not cause a problem in the precision of 3-4 bits, and the modes can be set merely by replacing the inexpensive components.

Figure 5:
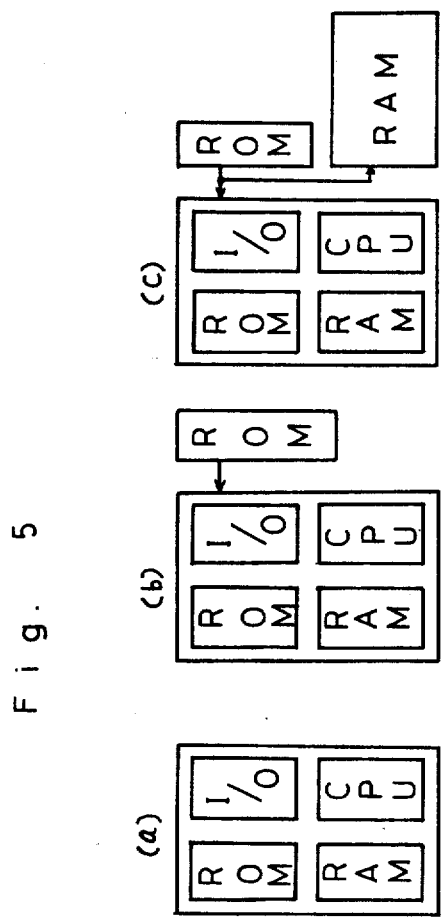
FIG. 5 is a schematic diagram showing the use of external ROMs and RAMs together.
Figure 6:
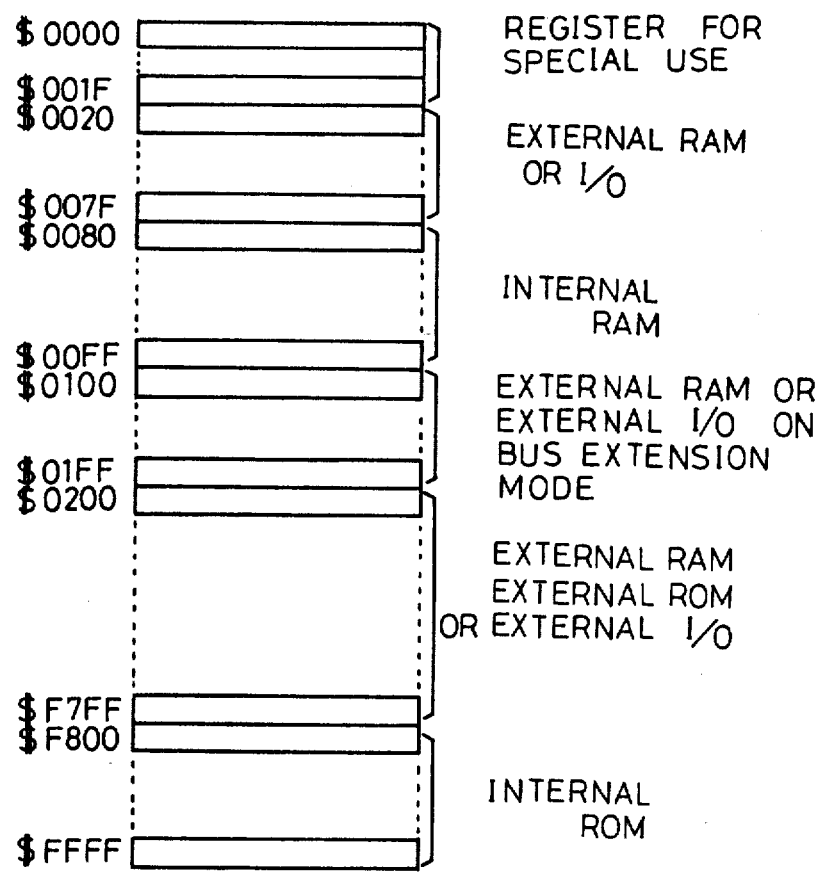
FIG. 6 is a memory map of an embodiment of the present invention.

When external and internal ROMs and RAMs are jointly used as memory areas for storing programs or data as illustrated in FIG. 5(a), (b), (c), memory maps can be altered by changing set operation modes. The largest utilizable address space is provided in the bus extension mode. FIG. 6 shows a memory map diagram in which up to 65 kbytes can be accessed.

Referring to FIG. 6, addresses $0020 to $007F access an external RAM or I/O circuit. An internal RAM is accessed by addresses $0080–$00FF. When a user wants to use the external RAM with the addresses of the internal RAM, an external RAM operation mode may be set. This method renders a further 128 bytes effective as an external RAM area. Addresses $0100–$01FF become valid in the bus extension mode. For example, the eight address lines of the port 4 have a capacity of 256 words. Among them, the upper bits unnecessary for the address lines can be used as I/O circuit inputs. The largest utilizable address space is given by the bus time-sharing extension mode. Addresses $0200–$F7FF can be used for the external RAM, an external ROM or the I/O circuit. Also, in this case, upper bits unnecessary for address lines can be utilized for the I/O circuit.

The present invention, thus, provides the following beneficial results:

(1) A plurality of operation modes can be set using a single input pin.

(2) The input/output electrical characteristics of the mode input pin circuitry are not changed.

(3) In operating the present invention, the scale of a microprocessor forms no limiting factor.

The present invention may be embodied in other specific forms without departing from the spirit or essential characteristics thereof. The presently disclosed embodiments are, therefore, to be considered in all respects as illustrative and not restrictive, the scope of the invention being indicated by the appended claims, rather than the foregoing description, and all changes which come within the meaning and range of equivalency of the claims are, therefore, to be embraced therein.

What is claimed is:

1. An operation mode setting system for a microprocessor operable in a plurality of operation modes, said operation mode setting system comprising in a single integrated circuit:

a microprocessor having a plurality of operation modes;

a reset input terminal connected to said microprocessor for receiving a reset signal;

a mode input terminal for receiving an analog voltage the amplitude of which determines exclusively a corresponding one of said plurality of operation modes;

an analog-to-digital converter means connected to said mode input terminal for converting said analog voltage to a digital signal representative of the amplitude thereof;

a decoder means connected to said analog-to-digital converter means for decoding said digital signal and connected to said microprocessor for generating a signal for setting said microprocessor at said one of said plurality of operation modes corresponding solely to the amplitude of said analog voltage; and means responsive to a reset signal applied to said reset input terminal for applying said decoded signal to said microprocessor to set the operation mode thereof when a reset signal is applied.

2. An operation mode setting system according to claim 1, wherein said integrated circuit comprises:

a register means connected to said analog-to-digital converter means for storing said digital signal; and a mode decoder means connected to said register means for decoding said digital signal stored in said register means.

3. An operation mode setting system according to claim 2, wherein said reset signal responsive means comprises an edge detector means for detecting an edge of a reset signal for initiating operation of the microprocessor; and AND gate means each having first and second input terminals and an output terminal, each of said first input terminals being connected to said edge detector means, each of said second input terminals being connected to said analog-to-digital converter means, each of said output terminals being connected to said register means, wherein said digital signal is applied to said register means via said AND gate means when said microprocessor operation is initiated by said reset signal.

4. An operation mode setting system according to claim 1, wherein said analog-to-digital converter means in said integrated circuit comprises a voltage comparator for comparing the analog voltage corresponding to the operation mode and a reference voltage; a digital value generator circuit, the output digital value thereof varying when the output of said voltage comparator is not equal to zero; a voltage generator; and a selector circuit coupled to said voltage generator and said digital value generator circuit for generating a plurality of analog voltages and selecting one of said analog voltages corresponding to the output digital value of said digital value generator circuit, wherein the selected analog voltage is said reference voltage, and the output signal of said analog-to-digital converter means is the output digital value of said digital value generator circuit when the output of said voltage comparator is zero.

5. An operating mode setting system for a microprocessor consisting of an integrated circuit on a single semiconductor substrate comprising:

a microprocessor having a plurality of operation modes greater than three;

an operation mode decoder connected to said microprocessor and responsive to a digital signal for setting a microprocessor mode of operation;

a digitizing circuit for producing a binary digital output signal representative of the amplitude of an applied analog input signal; said digital output signal being applied to said operation mode decoder as the digital input signal thereto;

a single mode input terminal for receiving said analog input signal, said mode input terminal being connected to said digitizing circuit to provide the analog input signal thereto;

a reset input terminal connected to said microprocessor for receiving a reset signal; and means responsive to a reset signal applied to said reset input terminal to cause said digital output signal to be applied to said operation mode decoder to set an operation mode of said microprocessor in accordance with the amplitude of an applied analog input signal at the time of said reset signal.

6. An operation mode setting system as recited in any one of claims 1, 2, 3, 4 or 5 further including an analog signal generator connected to said mode input terminal for providing an analog signal voltage to set said microprocessor operation mode.

* * * * *